US011072858B2

(12) United States Patent
Lee

(10) Patent No.: US 11,072,858 B2
(45) Date of Patent: Jul. 27, 2021

(54) PULSING MIXTURE OF PRECURSOR AND SUPERCRITICAL FLUID TO TREAT SUBSTRATE SURFACE

(71) Applicant: Nova Engineering Films, Inc., Los Altos Hills, CA (US)

(72) Inventor: Sang In Lee, Los Altos Hills, CA (US)

(73) Assignee: Nova Engineering Films, Inc., Los Altos Hills, CA (US)

(*) Notice: Subject to any disclaimer, the term of this patent is extended or adjusted under 35 U.S.C. 154(b) by 0 days.

(21) Appl. No.: 16/559,139

(22) Filed: Sep. 3, 2019

(65) Prior Publication Data
US 2020/0071830 A1  Mar. 5, 2020

Related U.S. Application Data

(60) Provisional application No. 62/727,417, filed on Sep. 5, 2018, provisional application No. 62/756,548, filed on Nov. 6, 2018.

(51) Int. Cl.
*C23C 16/455* (2006.01)
*B08B 7/00* (2006.01)
*H01L 21/02* (2006.01)
*D06M 23/10* (2006.01)

(52) U.S. Cl.
CPC ...... *C23C 16/45563* (2013.01); *B08B 7/0021* (2013.01); *D06M 23/105* (2013.01); *H01L 21/02101* (2013.01)

(58) Field of Classification Search
CPC .............. C23C 16/45563; C23C 16/30; C23C 16/45523; B08B 7/0021; H01L 21/02101; D06M 23/105
USPC ......................................................... 216/63
See application file for complete search history.

(56) References Cited

U.S. PATENT DOCUMENTS

| | | | | |
|---|---|---|---|---|
| 6,085,762 A | * | 7/2000 | Barton | B08B 3/102 134/186 |
| 7,267,727 B2 | * | 9/2007 | McDermott | B08B 3/12 134/1 |
| 2004/0096586 A1 | * | 5/2004 | Schulberg | H01L 21/67167 427/372.2 |
| 2007/0166226 A1 | * | 7/2007 | Holmes | C01G 23/053 423/659 |

* cited by examiner

*Primary Examiner* — Duy Vu N Deo
(74) *Attorney, Agent, or Firm* — Fenwick & West LLP

(57) ABSTRACT

An injecting assembly includes a nozzle that is formed with a mixture channel, a mixture opening communicating with the mixture channel, a shaper channel, and a shaper opening communicating with the shaper channel. A mixture of a precursor and a supercritical fluid (SCF) passes through the mixture channel. Waves of the mixture are periodically injected toward a surface of a substrate at the mixture opening. A stream of a shaping fluid flows through the shaper channel and is injected toward the substrate at the shaper opening. The stream of the shaping fluid confines the waves of the mixture. Molecules of the precursor penetrate into the substrate by impact of the wave fronts reaching the surface of the substrate. The molecules of the precursor can react with molecules of a material of the substrate to improve surface properties of the substrate.

21 Claims, 14 Drawing Sheets

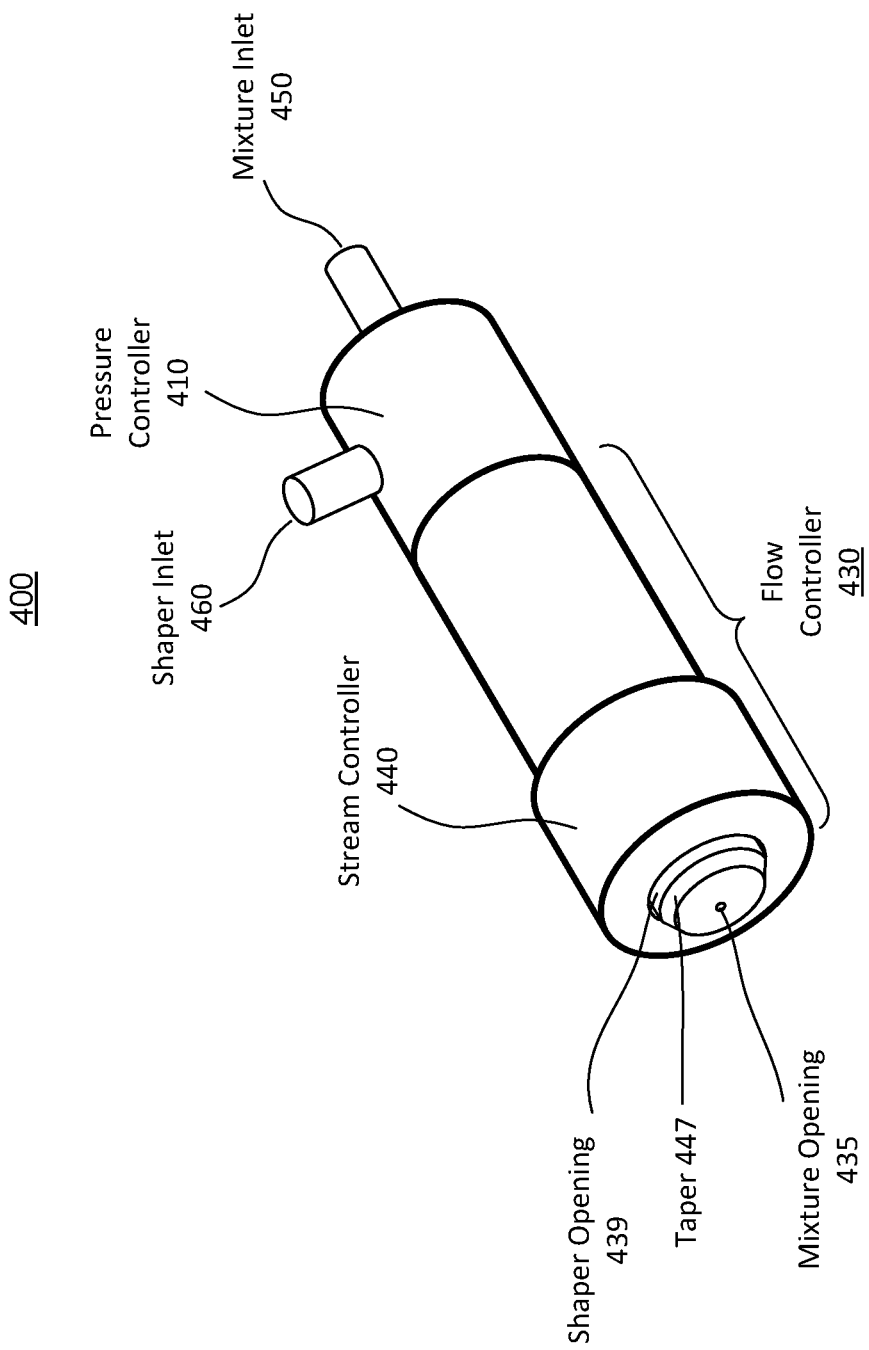

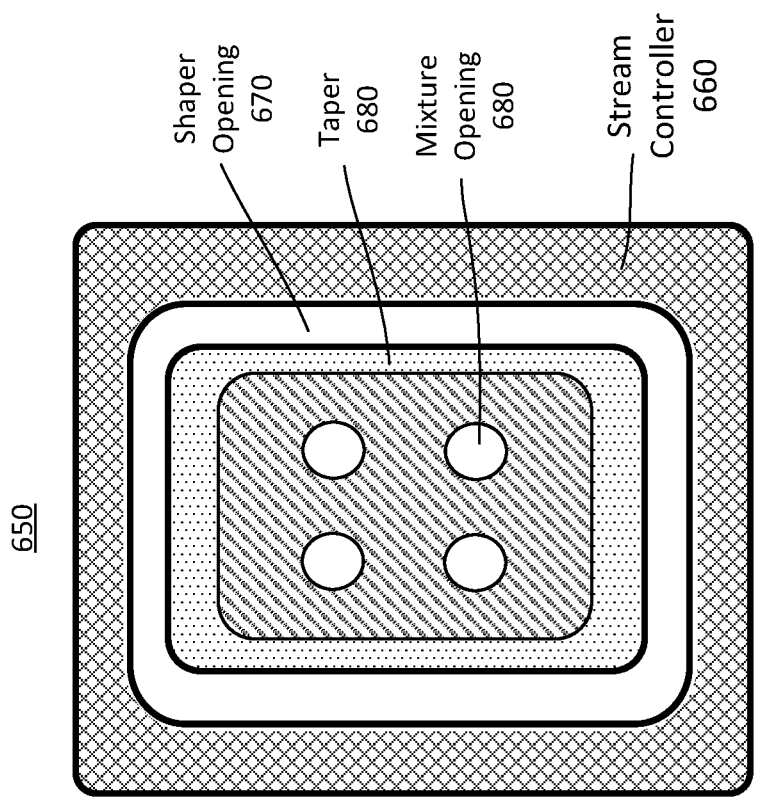
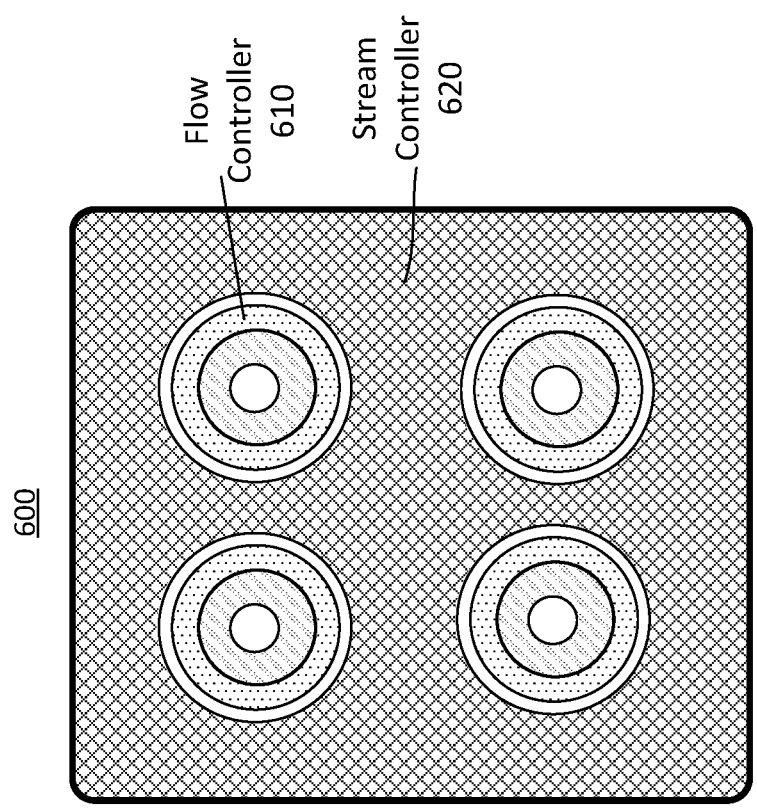
FIG. 6

PULSING MIXTURE OF PRECURSOR AND SUPERCRITICAL FLUID TO TREAT SUBSTRATE SURFACE

CROSS-REFERENCE TO RELATED APPLICATION

This application claims the benefit of U.S. Provisional Patent Application No. 62/727,417, filed on Sep. 5, 2018 and U.S. Provisional Patent Application No. 62/756,548, filed on Nov. 6, 2018, which are incorporated by reference herein in their entirety.

BACKGROUND

Field of the Disclosure

The present disclosure generally relates to surface treatment, and specifically to a method of improving surface properties of substrate by pulsing a mixture of a precursor and supercritical carrier fluid toward the substrate.

Description of the Related Arts

Infiltration/impregnation is used to improve surface properties of porous materials. In vapor phase infiltration/impregnation (VPI) processes, vapor phase precursors can diffuse into substrates and subsequently reacted with materials of the substrates to transform into solid states. For example, VPI processes can be used to form hybrid organic-inorganic materials from diffusion of metalorganic precursors into organic polymers. Infiltration/impregnation usually includes a hold step, during which adsorbed molecules of a precursor can diffuse into a porous material to improve properties of the porous material. However, with conventional injecting techniques, the hold step is time consuming and has low productivity. For example, molecules of the precursor can be drifted and scattered while traveling to the surface of the porous material and therefore a limited number of molecules of the precursor arrive at the surface and diffuse into the porous material. Also, the molecules that arrive at the surface may not have sufficient energy to penetrate into the porous material with the desired depth. Consequently, there are insufficient molecules of the precursor that can diffuse into the porous material for improving properties of the porous material.

SUMMARY

Embodiments relate to a method of improving surface properties of a substrate with pulses of a mixture of a precursor and a supercritical fluid (SCF). Waves of the mixture are periodically injected toward the substrate. The substrate is placed at atmosphere pressure that is lower than the critical pressure of the SCF. As the mixture propagates toward the substrate, the SCF converts to a gas phase and expands, causing a high velocity of the waves towards the substrate. The high velocity of the waves can reduce or eliminate drifting and scattering of the precursor and can also drive molecules of the precursor to penetrate into the substrate. The penetration length/depth is larger than the diffusion length/depth in a conventional infiltration process. The substrate can include an inorganic solid, organic solid, composite material, polymer, or viscous liquid. The penetration is also enhanced by impact of the wave fronts reaching the substrate. The molecules of the precursor that penetrate into the substrate can react with molecules of a material at the surface to improve properties of the surface.

In some embodiments, an injecting assembly of a surface treatment apparatus injects the waves of the mixture toward the substrate. The injecting assembly includes a nozzle formed with a mixture channel and a mixture opening. The mixture passes through a mixture channel to reach the mixture opening. The mixture opening periodically injects the waves toward the substrate. Shapes of the waves can be controlled by an angle of the mixture opening.

In some embodiments, the injecting assembly can also inject a shaping fluid toward the substrate to confine and/or shape the waves of the mixture. The shaper opening surrounds the mixture opening and communicates with the shaper channel. The shaping fluid passes through the shaper channel to reach the shaper opening. The shaper opening injects a stream of the shaping fluid toward the substrate. The shaping fluid can be the SCF in the mixture.

In some embodiments, in addition to the injecting assembly, the surface treatment apparatus may include an actuating assembly that drives the substrate to move relative to the injecting assembly. The actuating assembly includes a plurality of rollers and a motor that drives the rollers to rotate. The rollers are arranged on a top side and bottom side of the substrate. Rotation of the rollers moves the substrate in relative to the injecting assembly. The substrate moves during injecting of the waves so that different portions of the surface of the substrate can be treated.

In some embodiments, the surface treatment apparatus can also include a plasma generator that generates plasma radicals. The substrate is exposed to the plasma radicals. The plasma radicals can react with the molecules of the precursor that penetrate into the substrate to transform the molecules of the precursor into a solid state.

BRIEF DESCRIPTION OF THE DRAWINGS

The teachings of the embodiments can be readily understood by considering the following detailed description in conjunction with the accompanying drawings.

Figure (FIG. 1 is a schematic view of an injecting assembly, in accordance with an embodiment.

FIGS. 4A through 4C illustrate a circular nozzle, in accordance with an embodiment.

FIG. 6 illustrates two area nozzles, in accordance with an embodiment.

The figures depict various embodiments for purposes of illustration only.

DETAILED DESCRIPTION

In the following description of embodiments, numerous specific details are set forth in order to provide more thorough understanding. However, note that the embodiments may be practiced without one or more of these specific details. In other instances, well-known features have not been described in detail to avoid unnecessarily complicating the description.

Embodiments are described herein with reference to the figures where like reference numbers indicate identical or functionally similar elements. Also in the figures, the left most digits of each reference number correspond to the figure in which the reference number is first used.

Embodiments relate to treating a surface of a substrate by periodically injecting waves of a mixture including a precursor and a supercritical fluid (SCF) towards the substrate. The surface of the substrate is treated through penetration of molecules of the precursor into the substrate by impact of the wave fronts reaching the surface of the substrate. A stream of a shaping fluid may also be injected toward the substrate to confine the waves of the mixture. The substrate may be exposed to plasma radicals to react with the molecules of the precursor that penetrate into the substrate, thereby transform into a solid state.

Figure 1:
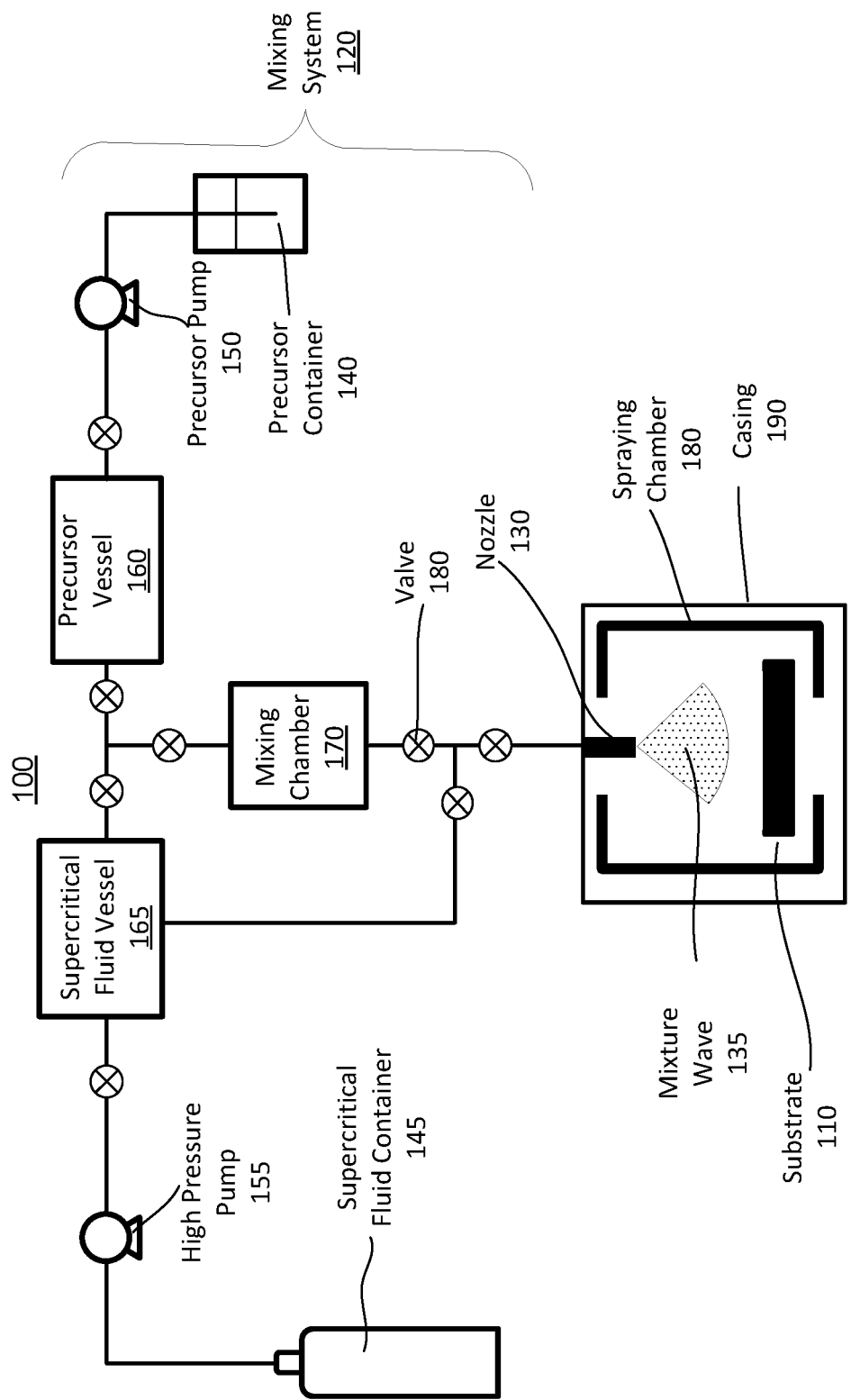

FIG. 1 is a schematic view of an injecting assembly 100, in accordance with an embodiment. The injecting assembly 100 periodically injects a precursor mixed with a SCF toward a substrate 110 to improve surface properties of the substrate 110. The injecting assembly 100 may include, among other components, a mixing system 120, a nozzle 130, a spraying chamber 180, and a casing 190.

The mixing system 120 mixes the precursor with the SCF. The mixing system 120 includes a precursor container 140, a precursor pump 150, a precursor vessel 160, a SCF container 145, a SCF pump 155, a SCF vessel 165, a mixing chamber 170, and a plurality of valves 180.

The precursor container 140 stores a precursor. The precursor can be a gas, liquid, or nano-sized solid. In some embodiments, the precursor has a boiling point higher than the temperature of the substrate or the temperature at which the injecting is performed. The precursor may exist as gas, liquid, or solid at atmospheric pressure. The precursor may include organic compounds, metalorganic compounds, or inorganic compounds. The precursor can be a Si-containing precursor, Aluminum-containing metal-organic precursor, Gallium-containing metal-organic precursor, transition metal-containing metal-organic precursor, noble metal-containing metal-organic precursor, and so on. Example materials of the precursor include: Trimethylaluminum, DMAON ($C_{11}H_{26}AlON$: $Al(CH_3)_2NC(CH_3)_3CH_2C(CH_3)_2OCH_3$,

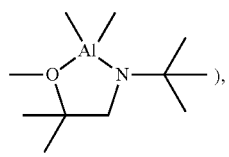

), Trisilylamine, PDMS (Polydimethylsiloxane), Silane coupling agents, Tetradimethylaminotitanium, Tetradimethylaminozirconium, Tetradimethylaminosilicon, silver sulfate, diol, thiol, amino, thio, and acids in carboxyl groups.

The precursor pump 150 pumps the precursor into the precursor vessel 160. In some embodiments, the precursor is pressurized to a pressure higher than a pressure in the precursor container 140 to convert the precursor from a gas phase or liquid phase in the precursor container 140 to a pressurized liquid phase in the precursor vessel 160. In some embodiment, the precursor stays as a gas phase in the precursor vessel 160.

The SCF container 145 stores a gas that can form a SCF at certain ranges of temperature and pressure above a critical point. The critical point of a SCF corresponds to a critical temperature and a critical pressure of the SCF, below which the SCF forms a gas phase. The SCF has no liquid/gas phase boundary and does not exhibit surface tension at a temperature and pressure above its critical point. The SCF dissolves the precursor and is used as a carrier fluid for carrying the precursor to the substrate 220. The SCF experiences an instantaneous volume expansion as it forms the gas phase. The instantaneous volume expansion can increase momentum and kinetic energy of the precursor and drive molecules of the precursor to penetrate into the substrate 110.

Various materials can be used as the SCF. One example material is carbon dioxide ($CO_2$). Its critical pressure is 73.8 bar, and its critical temperature is 31.1° C. Therefore, the SCF forms a gas phase as it enters into an ambient environment at atmospheric pressure and ambient temperature from a pressurized environment. Also, $CO_2$ is relatively inexpensive, nonflammable, and chemically inert. It will not be involved in the reaction between molecules of the precursor and molecules of a material at the surface of the substrate. In some embodiments, the SCF or its gas phase is conserved during the injecting process so that the use of $CO_2$ also does not create a problem with respect to the greenhouse effect. The SCF can also be other materials that are in liquid or gas phase in ambient condition, such as Methane, Ethane, Propane, Ethylene, Propylene, Methanol, Ethanol, Acetone, etc.

The SCF pump 155 pumps the gas and pressurize the gas to a pressure above the critical pressure of the SCF to form the SCF. The SCF flows into the SCF vessel 165, where the pressure is maintained.

The SCF and the precursor both flow into the mixing chamber 170 and are mixed to form the mixture. The mixing chamber 170 is at a pressure above the critical pressure of the SCF to maintain the SCF in the mixture. In some embodiments, the pressure of the mixture is above 10 bar. The mixture can be either in a liquid phase or a gas phase.

The casing 190 encloses the substrate 110, at least a portion of the nozzle 130, and the spraying chamber 180. The casing 190 provides a controlled environment (such as temperature, residual moisture level, gas, particulates, etc) at atmospheric pressure. It is advantageous that the injection is conducted at atmospheric pressure. First, a vacuum pump is not required. Second, the injecting assembly 100 can be more compact and less expensive. In some embodiments, the chamber is filled with a medium, such as Nitrogen.

The nozzle 130 injects a fluid (either gas or liquid) or spray a liquid toward the substrate 110. The nozzle 130 injects the mixture into the spraying chamber 180 toward the substrate 110. As the mixture is released into the chamber that is at atmospheric pressure, the pressure of the mixture drops to a pressure below the critical pressure of the SCF, causing an instantaneous expansion of the SCF. The instantaneous expansion of the SCF drives the precursor to move at a high velocity toward the substrate 110. In some embodiments, the precursor flows toward the substrate 110 at a velocity of at least 100 meters per second. With the high velocity, the precursor gains high kinetic energy, which can drive molecules of the precursor to penetrate into the substrate 110. In contrast to conventional infiltration/impregnation processes which are governed by the diffusion of the molecules of the precursor at the surface of the substrate, ballistic injection causes more molecules to enter into the substrate to a larger depth, so called enhanced diffusion by shock waves. The high velocity also saves time of the precursor reaching the substrate 110. In some embodiment, the precursor may arrive at the surface of the substrate 110 within no more than 5 milliseconds. Such injection of the pressured mixture is referred as "ballistic injection" due to the explosive volume expansion (or depressurizing phenomena such as detonation) of the SCF. Compared with conventional injection technologies, the ballistic injection is more efficient for surface treatment due to higher kinetic energy.

In some embodiments, the nozzle 130 periodically injects the pressured mixture as pulses into the chamber 140. The periodical injection of the pressurized mixture generates pulsating waves that propagate through the medium. Such injection of the pressured mixture is referred as "periodic ballistic injection." The wave-fronts form shock waves at the surface of the substrate 110. The shock waves can further enhance penetration of the molecules of the precursor into the substrate 110. Compared with continuous injection, periodic injection of the mixture modulates the density and the pressure of the medium, creates ballistic waves of the precursor. Also, the propagations of the ballistic waves and the wave fronts generate stronger impact on the substrate 110. With the periodic ballistic injection, hold steps are not necessary or can be minimized for the penetration. More details regarding periodic ballistic injection and penetration of the molecules of the precursor are described below in conjunction with FIGS. 2A, 2B, and 3.

Figure 2A:
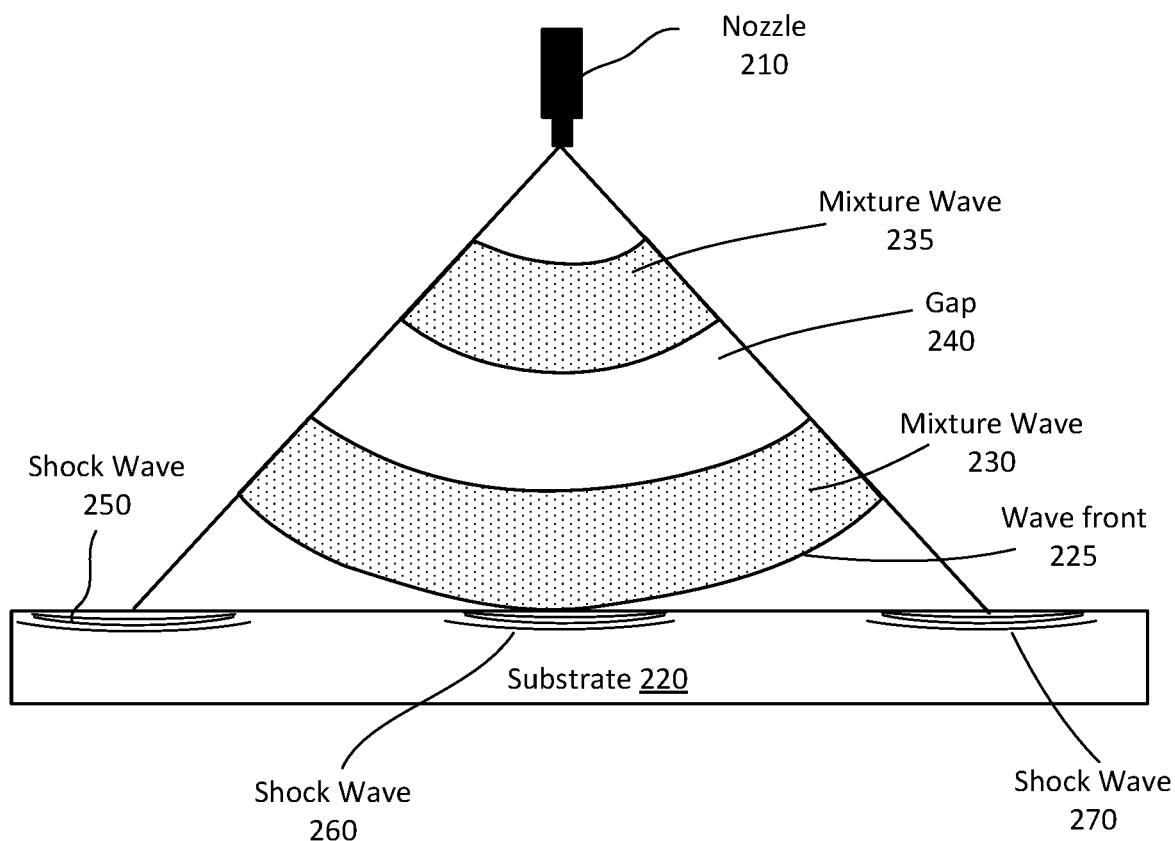
FIG. 2A illustrates periodic ballistic injection by a nozzle toward a substrate, in accordance with an embodiment.

FIG. 2A illustrates periodic ballistic injection by the nozzle 130 toward a substrate 220, in accordance with an embodiment. An embodiment of the nozzle 210 is the nozzle 130 in FIG. 1. In FIG. 2A, the nozzle 210 injects two waves 230 and 235 toward the substrate 220, as an example. A wave front 225 of the wave 230 reaches a surface of the substrate 220. Molecules of the precursor at the wave front 225 move ballistically with high kinetic energy and impinge against the surface. By impact of the wave front 225, a shock wave has created at the surface of the substrate. The shock wave 260 is at a center of the surface. The shock waves 250 and 270 are at edges of the surface. As the wave front 225 reaches the center of the surface, the shock wave 260 is formed at the center of the substrate. Further moving of the wave front 225 generates shock waves 250 and 270 at the edge of the substrate when (the edges of) the wave front meets the edges of the substrate. The high kinetic energy of the precursor and the shock waves over the surface of the substrate drive the molecules at the wave front 225 to penetrate into the substrate 220, resulting in a larger propagation/penetration depth than the diffusion in conventional impregnation/infiltration methods.

In some embodiments, the molecules of the precursor propagate/penetrate into the substrate 220 up to a depth of 10 nm. The depth of the propagation/penetration can be controlled by changing pulsing frequency, duty cycle, injection time, other parameters of the periodic ballistic injection, or some combination thereof. Also, the pulsing frequency and/or duty cycle can be controlled to reduce or eliminate drifting and scattering of the mixture while it propagates through the medium in the chamber.

Figure 2B:
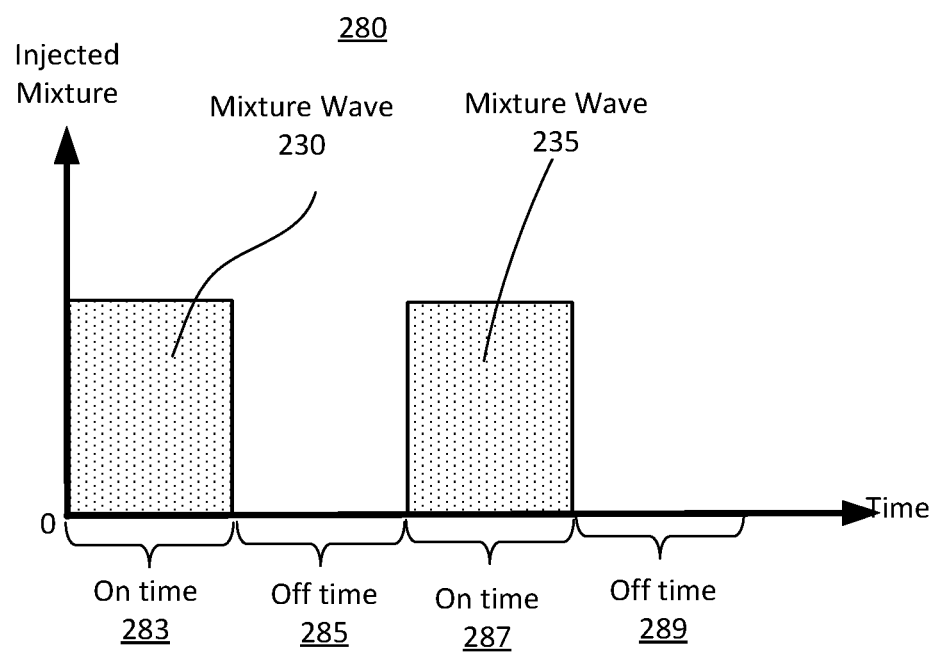
FIG. 2B shows an example duty cycle of the periodic ballistic injection, in accordance with an embodiment.

FIG. 2B shows an example duty cycle of the periodic ballistic injection, in accordance with an embodiment. The nozzle 210 injects the mixture during the ON times 283 and 287 and does not inject the mixture during the OFF times 285 and 289. In the embodiment of FIG. 2B, the duration of the ON times 283 and 287 equals the duration of the OFF times 285 and 289, so that the duty cycle is 50%. In other embodiments, the duty cycle can be less than 50% (i.e., the ON times are shorter than the OFF times) or higher than 50% (i.e., the ON times are longer than the OFF times).

The pulsing frequency of the periodic ballistic injection can vary. In some embodiments, the pulsing frequency is in a range from a few Hz to hundreds Hz.

Figure 3:
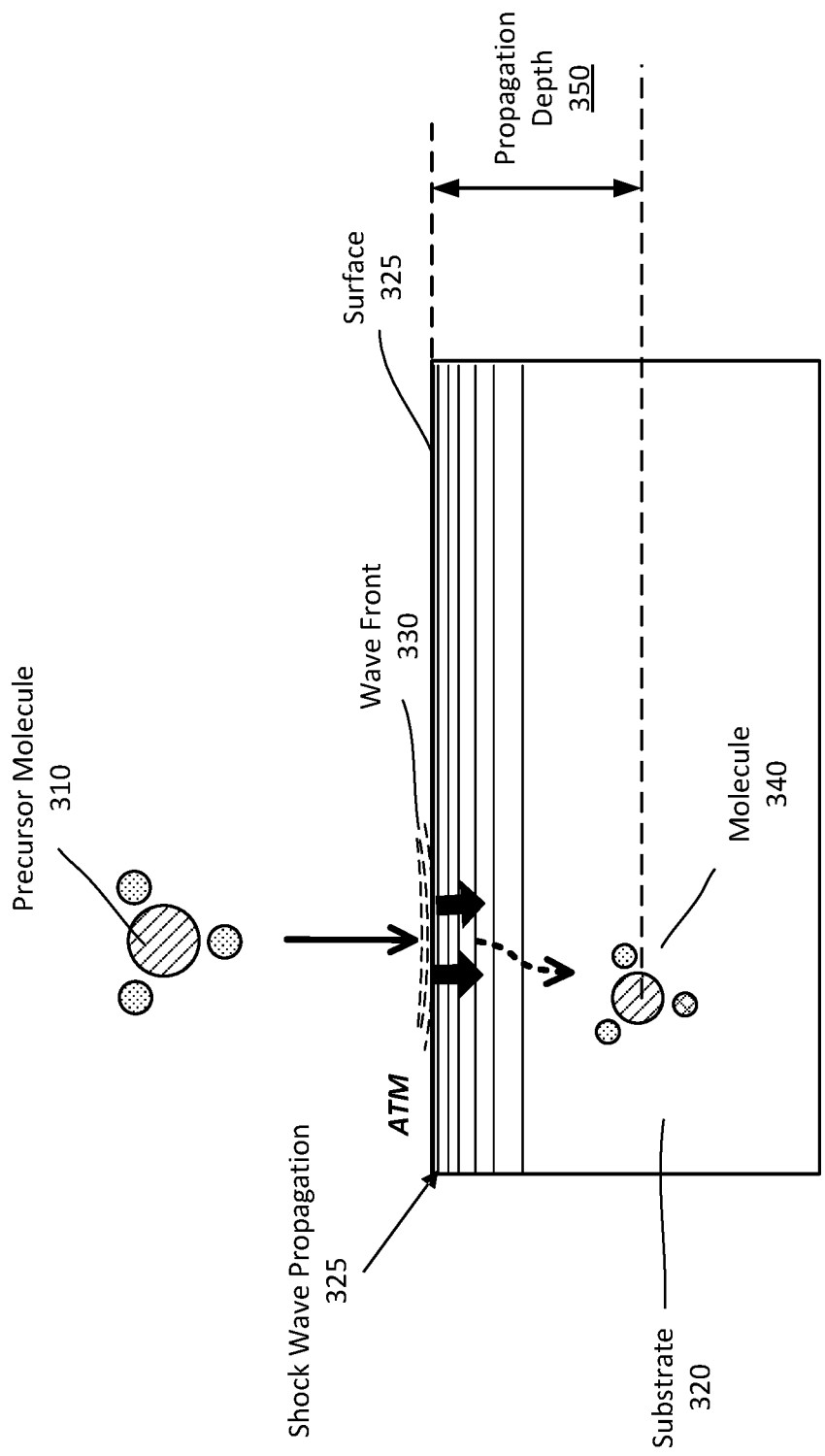
FIG. 3 illustrates penetration of a precursor molecule into a substrate, in accordance with an embodiment.

FIG. 3 illustrates penetration of a precursor molecule 310 into a substrate 320, in accordance with an embodiment. The precursor molecule 310 is at a wave front 330. It reaches a surface 325 of the substrate 320 at a high velocity. Also, impact of the wave front 330 at the surface 325 may generate shock waves as a result of energetic ballistic molecular bombardments and results in shock wave propagation 335. The velocity and shock wave propagation drive the precursor molecule 310 to penetrate into the substrate 320. The penetration is faster and deeper, compared with conventional infiltration/impregnation methods. A distance that the precursor molecule 310 travels within the substrate 320 is a propagation/penetration depth 350 of the precursor molecule 310. In one embodiment, the propagation/penetration depth 350 is at least 10 nm.

The precursor molecule 310 reacts with one or more molecules of a material of the substrate 320 to form a new molecule 340 beneath the surface 325. The surface 325 can be a viscous liquid surface. The substrate 320 can include inorganic solids, organic solids, composite materials, polymers, viscous liquids, starches, living organ tissues, cartilages, proteins, structurally loosen networks (such as reticular fibers, starches, bio-degradable plastics, etc), or some combination thereof. In some embodiments, the substrate 320 is flexible and porous. Examples of the substrate 320 include a polymer with porosity for liquid electrolyte applications (e.g. a separator in lithium ion battery), synthetic polymers with ionic properties without porosity for non-gas permeable applications (e.g. a proton conductor for proton exchange membrane (PEM) fuel cells), catalytic polymers with or without porosity (e.g. desalination membrane), etc.

The reaction may include an oxide formation (e.g., formation of $Al_2O_3$, $SiO_2$, $TiO_2$, $ZrO_2$, $WO_3$, or $HfO_2$), or nitride formation (e.g, formation of SiN, AlN, or BN), carbide formation, other types of chemical reaction, or some combination thereof. The reaction may include cross linking of the precursor molecule 310 with one or more molecules of the material of the substrate 320, such as molecules of a loosen structure of a viscous material.

The reaction improves properties of the surface 325, including physical properties, electrical properties, mechanical properties, chemical properties, or some combination thereof. Improved properties of the surface 325 can include higher working temperature, larger strength, improved wettability with gel/liquid electrolyte at thinner Li-ion battery separator, better resistance against bio-rejection of organ tissues, against better wettability with ocean water, better resistance against scratch or wear, higher hardness, or higher conversion efficiency in fuel cells through increased cationic conductivity, and so on.

Figure 4B:
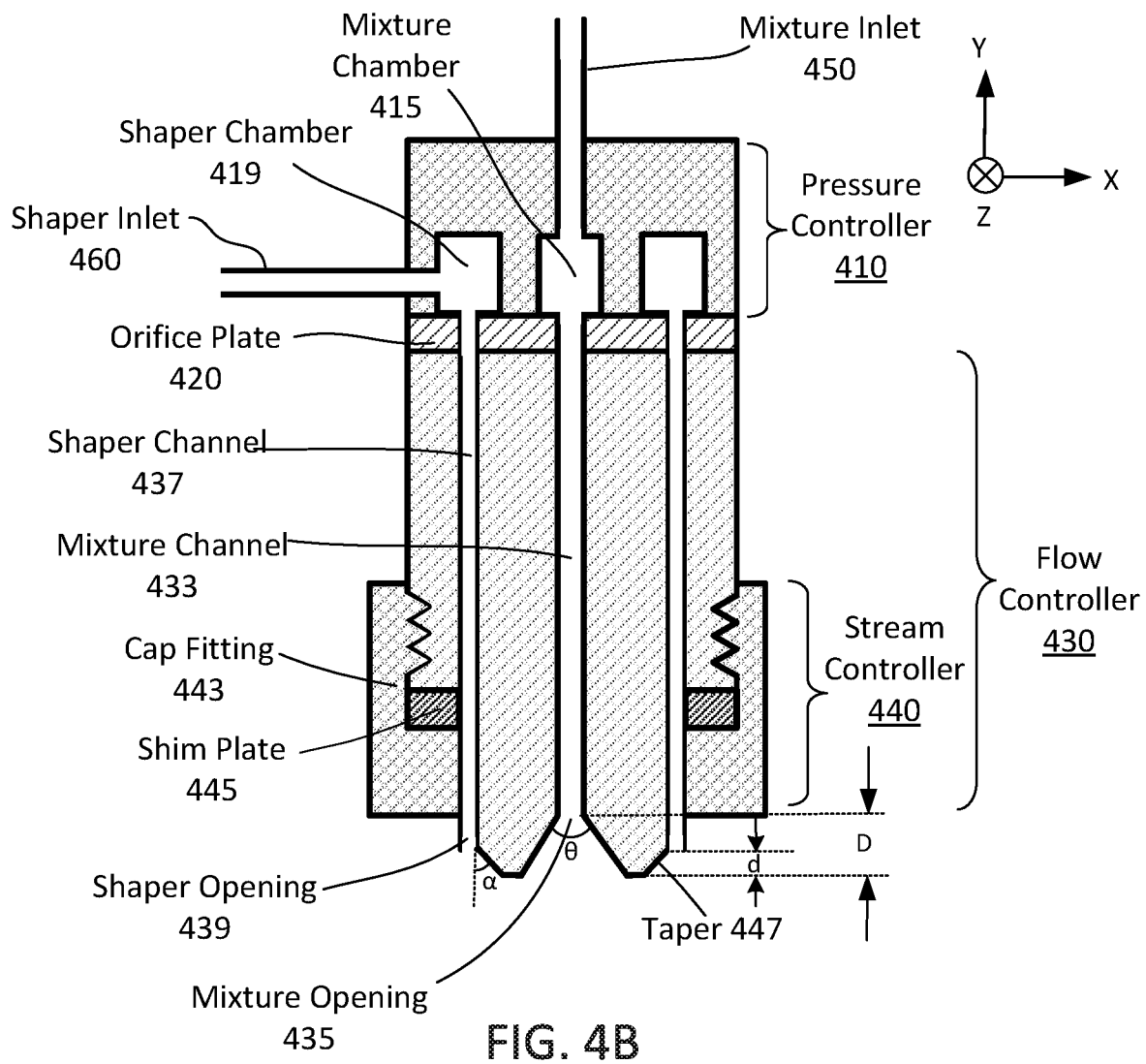
Figure 4C:
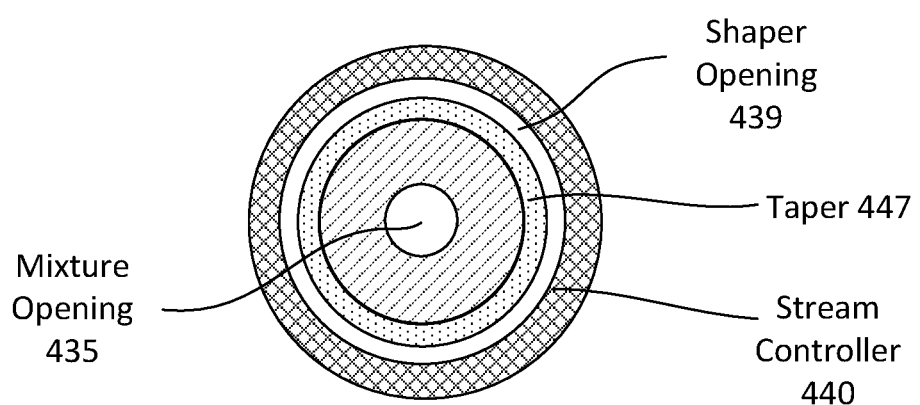

FIGS. 4A through 4C illustrate a circular nozzle 400, in accordance with an embodiment. FIG. 4A is a schematic perspective view of the nozzle 400, in accordance with an embodiment. FIG. 4B is a schematic cross-sectional view of the nozzle 400, in accordance with an embodiment. FIG. 4C is a schematic top view of the nozzle 400, in accordance with an embodiment. The nozzle 400 periodically injects waves of a mixture of a precursor and a supercritical fluid for treating a surface of a substrate and also injects a shaping fluid to confine the waves. The waves of the mixture and the shaping fluid flow along the Y direction. The nozzle 400 has a circular cross section, as shown in FIG. 4C. In the embodiment of FIGS. 4A through C, the nozzle 400 includes a pressure controller 410, a flow controller 430, a stream controller 440, a mixture inlet 450, and a shaper inlet 460. The nozzle 400 can an embodiment of the nozzle 130 in FIG. 1 or the nozzle 210 in FIG. 2A.

The pressure controller 410 controls pressure of the mixture. The pressure controller 410 includes a body formed with a mixture chamber 415 and a shaper chamber 419. The mixture chamber 415 receives the mixture from the mixture inlet 450. The mixture chamber 415 has a volume that is determined based on a desired pressure of the mixture. In some embodiments, the mixture from the mixture inlet 450 is pressurized and has an initial pressure $P_s$. The mixture chamber 415 has a smaller cross-sectional area in the X direction than the mixture inlet 450 in the X direction, as illustrated in FIG. 4B, so that the mixture chamber 415 can decrease the pressure of the mixture. In some embodiments, the body of the pressure controller 410 is not formed with the mixture chamber 415 so that the mixture flows from the mixture inlet 450 directly into the mixture channel 433 without change in pressure.

The shaper chamber 419 receives the shaping fluid from the shaper inlet 460. The shaper chamber 419 has a volume that is determined based on a desired pressure of the shaping fluid. In some embodiments, the shaper chamber 419 changes the pressure of the shaping fluid to a pressure $P_1$. The volume of the shaper chamber 419 is larger than the volume of the mixture chamber 415 so that $P_1$ is lower than $P_0$. $P_1$ can be in a range from 30 bar to 100 bar. The shaping fluid can be a SCF or a gas. In some embodiments, the shaping fluid is the same material as the SCF in the mixture. In embodiments where the shaping fluid is a SCF, $P_1$ is higher than the critical pressure of the SCF.

The flow controller 430 controls flow of the mixture and flow of the shaping fluid within the nozzle 400 and from the nozzle 400. The flow controller 430 includes an orifice plate 420 and a body formed with a mixture channel 433, a mixture opening 435, a shaper channel 437, and a shaper opening 439.

The orifice plate 420 changes sizes of an opening of the mixture chamber 415 that communicates with the mixture channel 433 and/or an opening of the shaper chamber 419 that communicates with the shaper channel 437. The orifice plate 420 can be used to reduce the pressure of the mixture and/or shaping fluid, restricting flow of the mixture and/or shaping fluid, measuring flow rate of the mixture and/or shaping fluid, etc.

The mixture channel 433 passes the mixture from the mixture chamber 415 to the mixture opening 435. The cross-section of the mixture channel 433 in the X direction is smaller than the cross-section of the mixture chamber 415 in the X direction, as indicated in FIG. 4B. In some embodiments, a width of the mixture channel 433 in the X direction is in a range from 0.005 inch to 0.05 inch.

The mixture opening 435 injects pulses of the mixture toward the substrate. The mixing opening 435 is at a tip of the nozzle 400. The mixture opening has an angle θ, as shown in FIG. 4B. Shapes of the waves can be changed by changing the angle θ. For instance, the waves are narrower if the angle θ is changed to be smaller.

The shaper channel 437 passes the shaping fluid from the shaper chamber 419 to the shaper opening 439. The shaper channel 437 has a smaller cross-sectional area in the X direction than the shaper chamber 419, as indicated in FIG. 4B. In some embodiments, a width of the shaper channel 437 in the X direction a range from 0.005 inch to 0.05 inch. The shaper opening 250 injects a stream of the shaping fluid toward the substrate. The shaper opening 439 surrounds the mixture opening 435 so that the stream of the shaping fluid can confine the waves of the mixture injected by the mixture opening 435. In the embodiment of FIGS. 4A through 4C, the shaper opening 439 is ring shaped, and the mixture opening 435 is a circular hole. In other embodiments, the shaping opening 439 and/or the mixture opening 435 can have other shapes.

As the waves of the mixture are confined by the stream of the shaping fluid, expansion of the waves can be reduced or even avoided. Therefore, decrease in the pressure and velocity of the mixture can be reduced or avoided. Also, uniform injection of the precursor in the X-Z plane can be achieved. The stream of the shaping fluid can also shape the waves or function as a lens to disperse, collimate, or focus the waves. A physical component may be added to the nozzle 400 to further confine the waves.

The stream controller 440 controls flow rate and shape of both the waves of the mixture and the shaping fluid stream. The stream controller 440 is arranged on top of the mixture opening 435 and shaper opening 439 along the Y direction. The stream controller 440 includes a cap fitting 443, a shim plate 445, and a taper 447. The cap fitting 443 is arranged on the body of the flow controller 430 in the vicinity of the mixture opening 435 and shaper opening 439 along the flow direction of the mixture and shaping fluid. The shim plate 445 can be used to change a protrusion height D shown in FIG. 4B. D represents a distance from the bottom of the cap fitting 443 to a bottom of the body of the flow controller 430 along the X direction. As D is adjusted, the flow rate and shape of the waves of the mixture are changed. The shim plate can also be used to change the width of the shaper channel 437 in the X direction. As the width of the shaper channel 437 is adjusted, the flow rate of the shaping fluid stream can be changed.

The taper 447 is formed on the body of the flow controller 430 and is located at a side of the shaper opening 439. The taper 447 has an angle α and a height d, as shown in FIG. 4B. The flow rate and shape of the shaping fluid stream can be adjusted by changing either the angle α or height d. As the angle α is changed to be smaller or the height d is changed to be smaller, the shaping fluid stream is narrower.

Figure 5A:
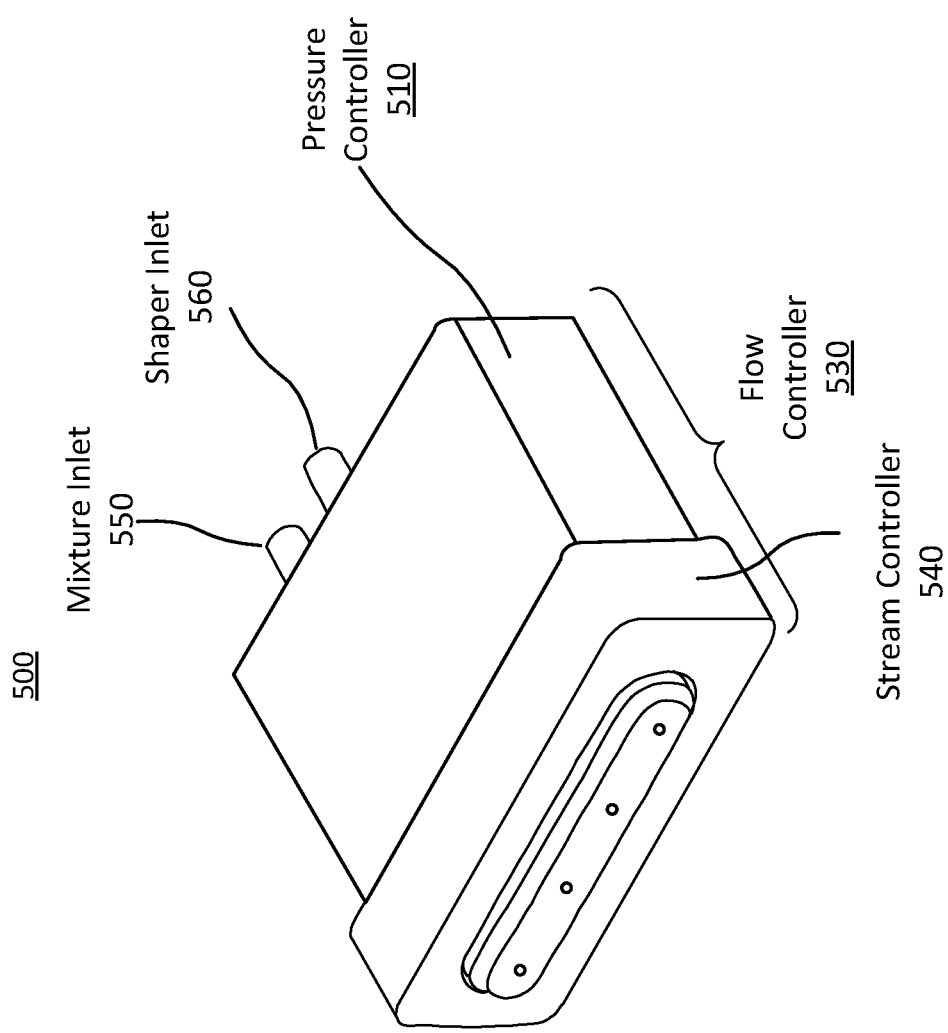
FIGS. 5A and 5B illustrate a linear nozzle, in accordance with an embodiment.
Figure 5B:
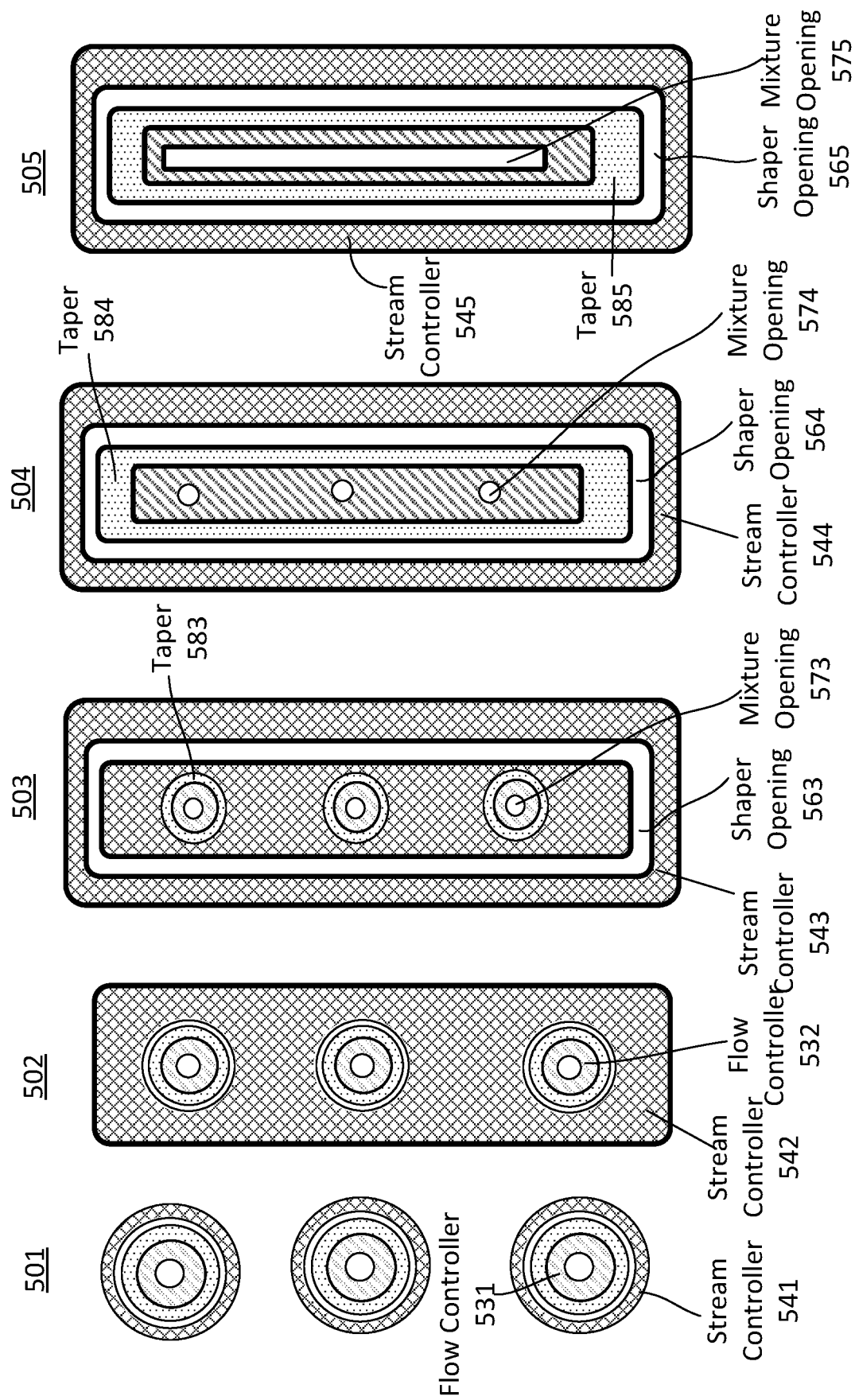

FIGS. 5A and 5B illustrate a linear nozzle 500, in accordance with an embodiment. FIG. 5A is a perspective view of the linear nozzle 500, in accordance with an embodiment. The linear nozzle 500 periodically injects waves of a mixture of a precursor and a supercritical fluid for improving surface properties of a substrate. The linear nozzle 500 also injects a shaping fluid to confine the waves. The linear nozzle 500 has a rectangular cross section. In the embodiment of FIGS. 5A and 5B, the linear nozzle 500 includes a pressure controller 510, one or more flow controllers 530, one or more stream controllers 540, a mixture inlet 550, and a shaper inlet 560. In other embodiments, the linear nozzle 500 can include other components or less components. The linear nozzle 500 can an embodiment of the nozzle 130 in FIG. 1 or the nozzle 210 in FIG. 2A.

FIG. 5B illustrates various configures 501, 502, 503, 504, and 505 of the linear nozzle 500, in accordance with an embodiment. The configuration 501 includes a plurality of circular nozzles that are arranged along a straight line. Each circular nozzle includes a flow controller 531 and a stream controller 541. An embodiment of the flow controller 531 is the flow controller 430 in FIG. 4. An embodiment of the stream controller 541 is the stream controller 440 in FIG. 4.

The configuration 502 includes a plurality of flow controllers 532 and a common stream controller 542. The flow controllers 532 are arranged along a straight line. An embodiment of the flow controller 532 is the flow controller 430 in FIG. 4. The stream controller 542 controls flow rate and shape of a shaping fluid stream and waves of the mixture injected by the linear nozzle 500.

The configuration 503 includes a flow controller and a stream controller 543. The formed with a shaper opening 563 and a plurality of mixture openings 573 arranged along a straight line. The mixture openings 573 communicate with a common mixture channel (not shown in FIG. 5B), but is associated with a separate taper 583. An embodiment of the taper 583 is the taper 447 in FIGS. 4A-C. The shaper opening 563 surrounds the mixture openings 573 to inject a stream of shaping fluid to confine waves injected by the mixture openings 573.

The configuration 504 includes a flow controller and a stream controller 544. The flow controller is formed with a shaper opening 564 and a plurality of mixture openings 574 arranged along a straight line. The mixture openings 574 communicates with a common mixture channel (not shown in FIG. 5B) and are associated with a common taper 584. The shaper opening 564 surrounds the mixture openings 574 to inject a stream of shaping fluid to confine waves injected by the mixture openings 574.

The configuration 505 includes a flow controller and a stream controller 545. The formed with a shaper opening 565 and a mixture opening 575. The mixture opening 575 has a shape of a rectangular and is associated with a taper 585. The shaper opening 565 surrounds the mixture opening 575 to inject a stream of shaping fluid to confine waves injected by the mixture openings 575.

FIG. 6 illustrates two area nozzles 600 and 650, in accordance with an embodiment. The area nozzle 600 includes a plurality of flow controllers 610 and a common stream controller 620. Each flow controller 610 can periodically inject waves of a mixture of a precursor and a SCF and can also inject a stream of shaping fluid to confine the waves. An embodiment of a flow controller 610 is the flow controller 430 in FIG. 4B. The flow controllers 610 are arranged into a two-dimensional array. The stream controller 620 controls the stream of the shaping fluid injected by each flow controller 610.

The area nozzle 650 includes a flow controller and a stream controller 660. The flow controller is formed with a shaper opening 670 and a plurality of mixture openings 680. Each mixture opening 680 can periodically injects waves of a mixture of a precursor and a SCF. The mixture openings 680 are arranged into a two-dimensional array. The mixture openings 574 communicates with a common mixture channel (not shown in FIG. 6) and are associated with a common taper 680. The shaper opening 670 surrounds the mixture openings 680 to inject a stream of a shaping fluid to confine waves injected by the mixture openings 670.

Figure 7:
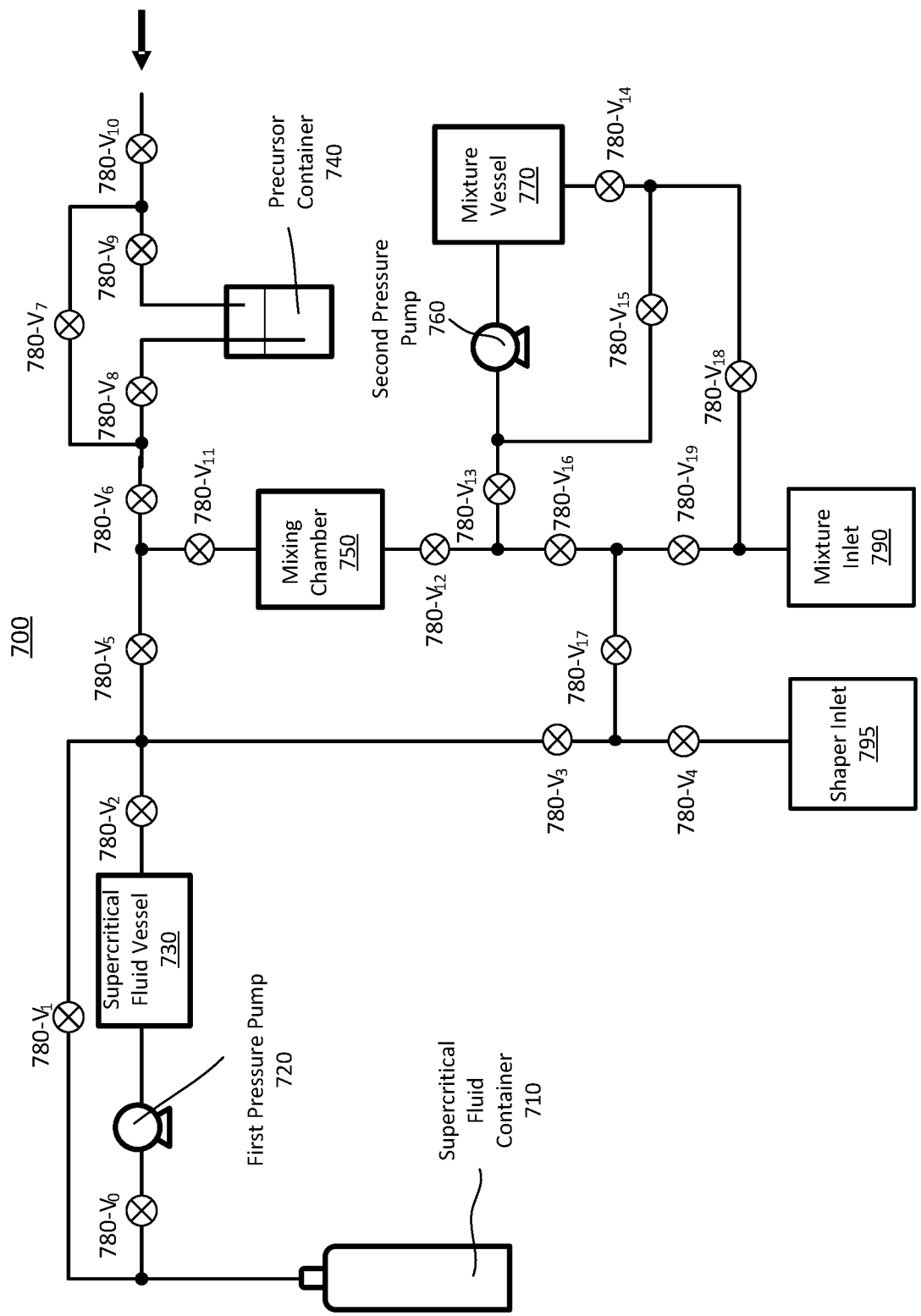
FIG. 7 illustrates a mixing system for mixing fluids and controlling flow of fluids into a nozzle, in accordance with an embodiment.

FIG. 7 illustrates a mixing system 700 for mixing fluids and controlling flow of fluids into a nozzle, in accordance with an embodiment. The mixing system 700 includes a SCF container 710, a first pressure pump 720, a SCF vessel 730, a precursor container 740, a mixing chamber 750, a second pressure pump 760, a mixture vessel 770, and a plurality of valves 780. The mixing system 700 is an embodiment of the mixing system 120 described in conjunction with FIG. 1.

In some embodiments, the SCF container 710 stores a gas (such as carbon dioxide gas) that can convert to a SCF at a temperature and pressure above a critical temperature and critical pressure. The precursor is in a gas phases in the precursor container 740. For instance, the precursor can be a non-resolving precursor vaporized from either a liquid phase or a solid phase. The valves $780\text{-}V_1$, $780\text{-}V_5$, $780\text{-}V_6$, $780\text{-}V_8$, $780\text{-}V_9$, $780\text{-}V_{10}$, and $780\text{-}V_{11}$ are open to mix the gas precursor and the gas in the mixing chamber 750. The valves $780\text{-}V_{12}$ and $780\text{-}V_{13}$ are open to allow the mixture (i.e., the mixed gas) to flow into the second pressure pump 760. The second pressure pump 760 pumps the mixture into the mixture vessel 770 to produce a pressurized mixture. The pressurized mixture can be a mixture of the precursor and the SCF. The valves $780\text{-}V_{14}$ and $780\text{-}V_{18}$ are open to allow the pressurized mixture to the mixture inlet 790 to be injected by the nozzle.

In some embodiments, the precursor is in a gas phases in the precursor container 740. The valves $780\text{-}V_6$, $780\text{-}V_8$, $780\text{-}V_9$, $780\text{-}V_{10}$, and $780\text{-}V_{11}$ are open to fill the gas precursor without the SCF in the mixing chamber 750. The valves $780\text{-}V_{12}$ and $780\text{-}V_{13}$ are open to allow the precursor to flow into the pressure pump 760. The pressure pump 760 pumps the precursor into the vessel 770 to produce a pressurized precursor, i.e. the SCF of the precursor. The pressurized precursor can be used itself as a source of the SCF. The valves $780\text{-}V_{14}$ and $780\text{-}V_{18}$ are open to allow the pressurized precursor to the mixture inlet 790 to be injected by the nozzle.

In some embodiments, the gas precursor is mixed with the SCF in the mixing chamber 750. The valve $780\text{-}V_0$ can be open to allow the gas in the SCF container 710 to flow into the first pressure pump 720. The first pressure pump 720 pumps the gas into the SCF vessel 730 to increase the pressure of the gas and convert the gas into the SCF. The valves $780\text{-}V_2$ and $780\text{-}V_5$ are open so that the SCF flows from the SCF vessel 730 to the mixing chamber 750. The mixture of the precursor and SCF can be pressurized by the second pressure pump 760.

The valves $780\text{-}V_{17}$ and $780\text{-}V_{19}$ can be used to make alternating pulses of the mixture and the SCF. For instance, SCF can be injected by opening the valves $780\text{-}V_{17}$ and $780\text{-}V_{19}$ and closing the valve $780\text{-}V_{18}$.

In some embodiments, the precursor is in a liquid phase. The valves $780\text{-}V_0$, $780\text{-}V_2$, $780\text{-}V_5$, $780\text{-}V_6$, $780\text{-}V_8$, $780\text{-}V_9$, $780\text{-}V_{10}$, and $780\text{-}V_{11}$ are open to mix the liquid precursor with the SCF at the mixing chamber 750. The mixture (i.e., the mixed liquid) flows into the mixture inlet when the 780-Valves $780\text{-}V_{12}$, $780\text{-}V_{16}$ and $780\text{-}V_{19}$ are open. The valve $780\text{-}V_{13}$ can be open while $780\text{-}V_{16}$ and $780\text{-}V_{19}$ are closed to allow the mixture to flow into the second pressure pump 760 to be further pressurized.

In some embodiments, the SCF can be injected by the nozzle as a shaping fluid to confine the waves of the injected mixture. The valves $780\text{-}V_2$, $780\text{-}V_3$, and $780\text{-}V_4$ are open to allow the SCF to flow into the shaper inlet 795 of the nozzle for injecting a stream of the SCF.

In some embodiments, the gas in the SCF container 710 can be used to flush the nozzle after injection of the mixture.

The valves 780-$V_1$, 780-$V_3$, 780-$V_{17}$ and 780-$V_{19}$ are open after the injection to allow the gas to flow into the mixture inlet 790.

Figure 8:
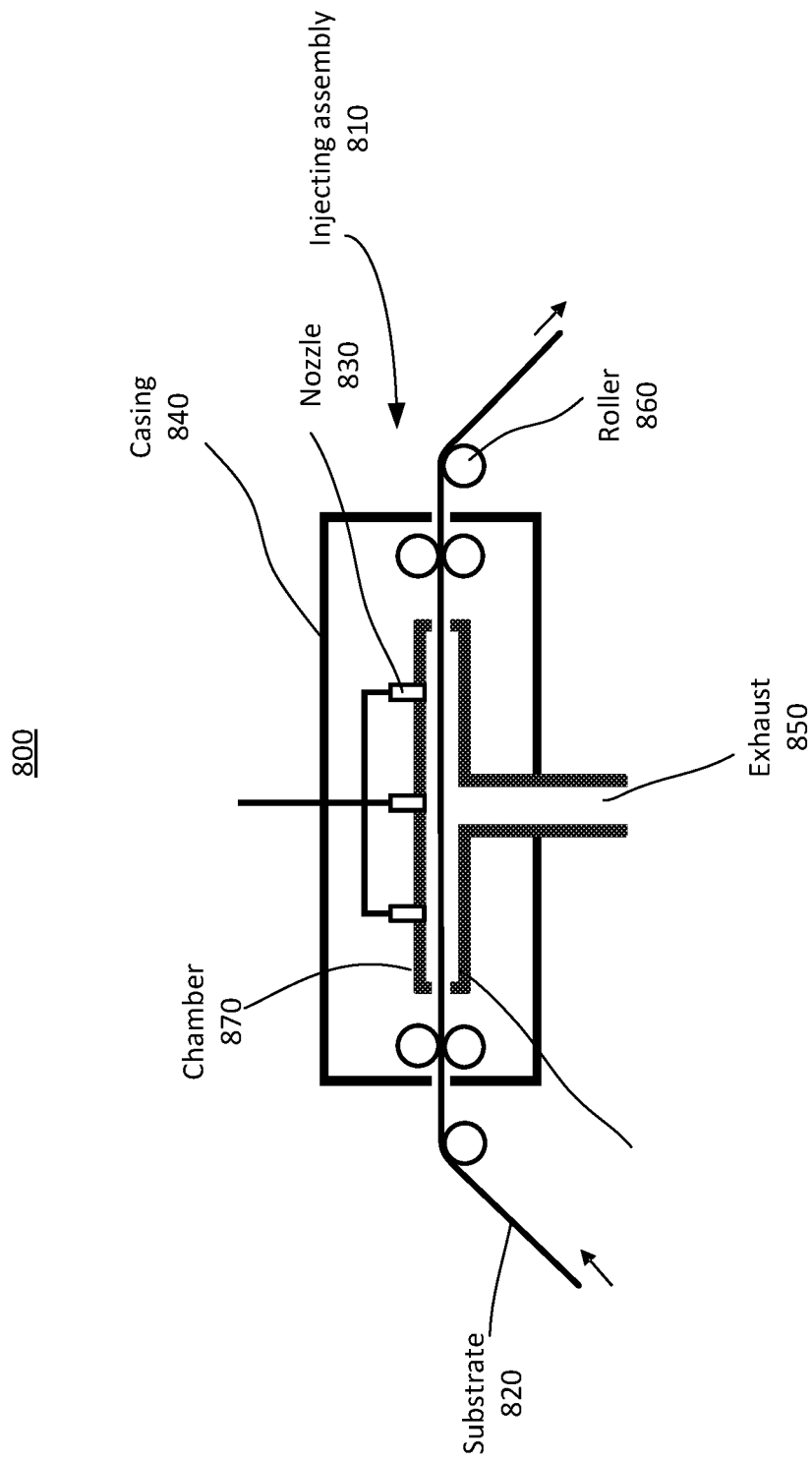
FIG. 8 is a schematic cross-sectional view of a surface treatment apparatus including an actuating assembly, in accordance with an embodiment.

FIG. 8 is a schematic cross-sectional view of a surface treatment apparatus 800 including an actuating assembly, in accordance with an embodiment. The surface treatment apparatus 800 is configured to improve surface properties of a substrate 820. In addition to the actuating assembly, the surface treatment apparatus 800 also includes an injecting assembly 810.

The injecting assembly 810 periodically injects a mixture of a precursor and a SCF toward the substrate 820. The injecting assembly 810 includes a plurality of nozzles 830, a chamber 870, and a casing 840. The nozzles 830 inject the mixture toward the substrate 820. The nozzles 830 are enclosed in the casing 840. The casing 840 provides a controlled environment at atmosphere pressure. The injecting assembly 810 is also formed with an exhaust 850 that allows remaining mixture to exit the chamber 870. An embodiment of the injecting assembly 830 is the injecting assembly 100 in FIG. 1.

The actuating assembly drives the substrate to move relative to the injecting assembly 810. The actuating assembly includes a plurality of rollers 860 arranged on opposite sides of the substrate 820 and a motor (not shown in FIG. 8) that drives the rollers 860 to rotate. The rotation of the driving rollers moves the substrate in a direction indicated by the arrows in FIG. 8. In some other embodiments, the actuating assembly drives the injecting assembly 810 to move relative to the substrate 820 or drives both the injecting assembly 810 and the substrate 820 to move relative to each other.

In some embodiments, the substrate moves at a speed in a range from 1 centimeter per minute to 1,000 centimeters per minute. The moving speed of the substrate can be determined based on a material of the substrate, pulsing frequency of the mixture, a desired penetration depth, etc.

Figure 9:
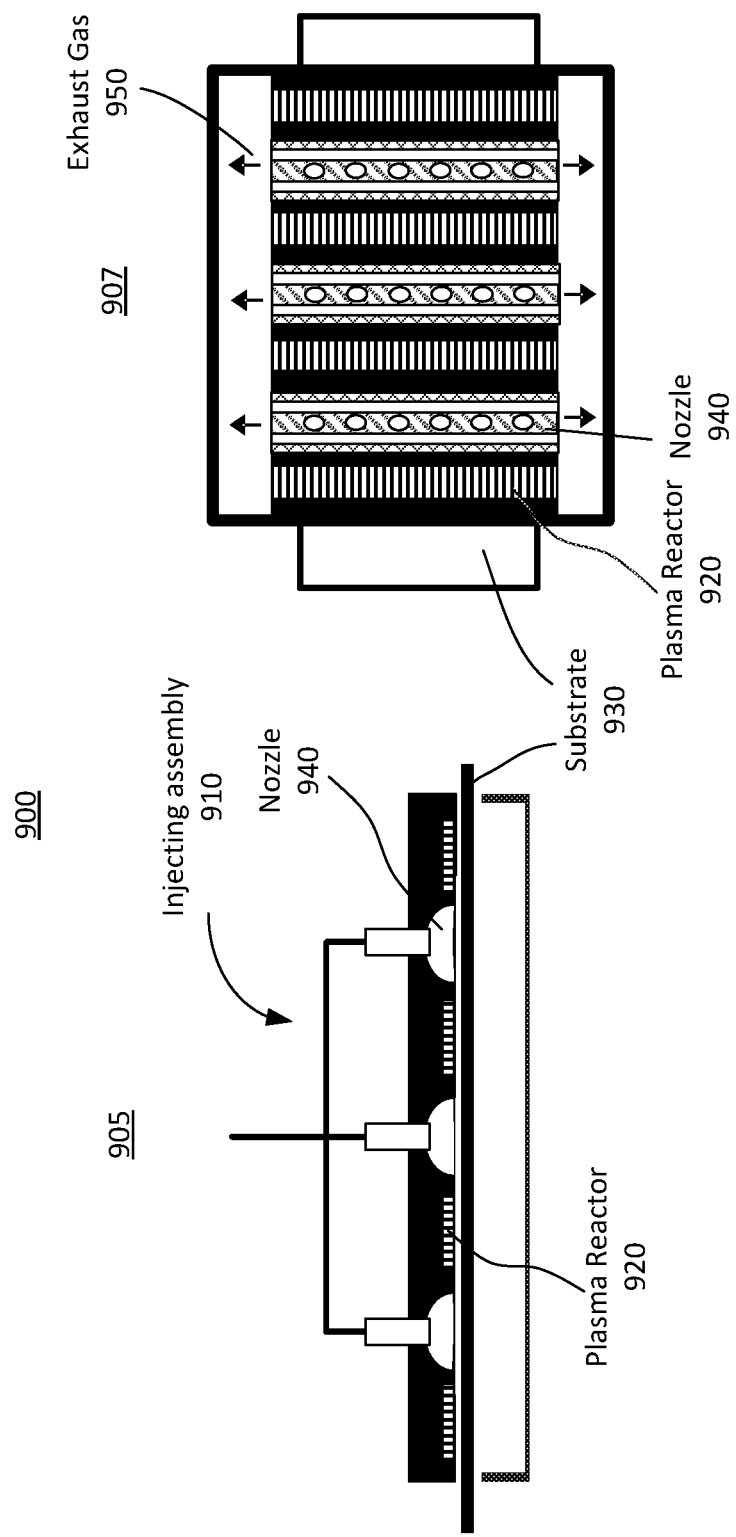
FIG. 9 is a schematic cross-sectional view and a top view of a surface treatment apparatus including a plasma generator, in accordance with an embodiment.

FIG. 9 is a schematic cross-sectional view 905 and a top view 907 of a surface treatment apparatus 900 including a plasma generator 920, in accordance with an embodiment. The surface treatment apparatus 900 is configured to improve surface properties of a substrate 930. In addition to the plasma generator 920, the surface treatment apparatus 900 also includes an injecting assembly 910.

The injecting assembly 910 periodically injects a mixture of a precursor and a SCF toward the substrate 930. The injecting assembly 910 includes a plurality of nozzles 940 and the exhausts (side-exhausts here) volatile by-products, SCF, excess precursor mixture and plasma gas, or some combination thereof through the exhaust. An embodiment of the injecting assembly 910 is the injecting assembly 100 in FIG. 1.

The plasma generator 920 generates plasma radicals from a plasma gas. The substrate 940 is exposed to the plasma radicals. The plasma radicals can react with molecules of the precursor that have penetrated into the substrate to transform the molecules into a solid phase. The plasma gas can be a mixture of $NH_3$, $H_2$, $N_2O$, $O_2$, $H_2O$, $O_3$, or other gas with Argon. In one example, the plasma generator 920 generates N* radicals by using a mixture of $NH_3$, Ar, and $N_2$. The plasma generator 920 generates H* radicals by using a mixture of Ar and $H_2$.

Exhaust gas 950 is discharged from the surface treatment apparatus 900. The exhaust gas 950 includes volatile by-products, SCF, excess precursor mixture and plasma gas, or some combination thereof through the exhaust.

Figure 10:
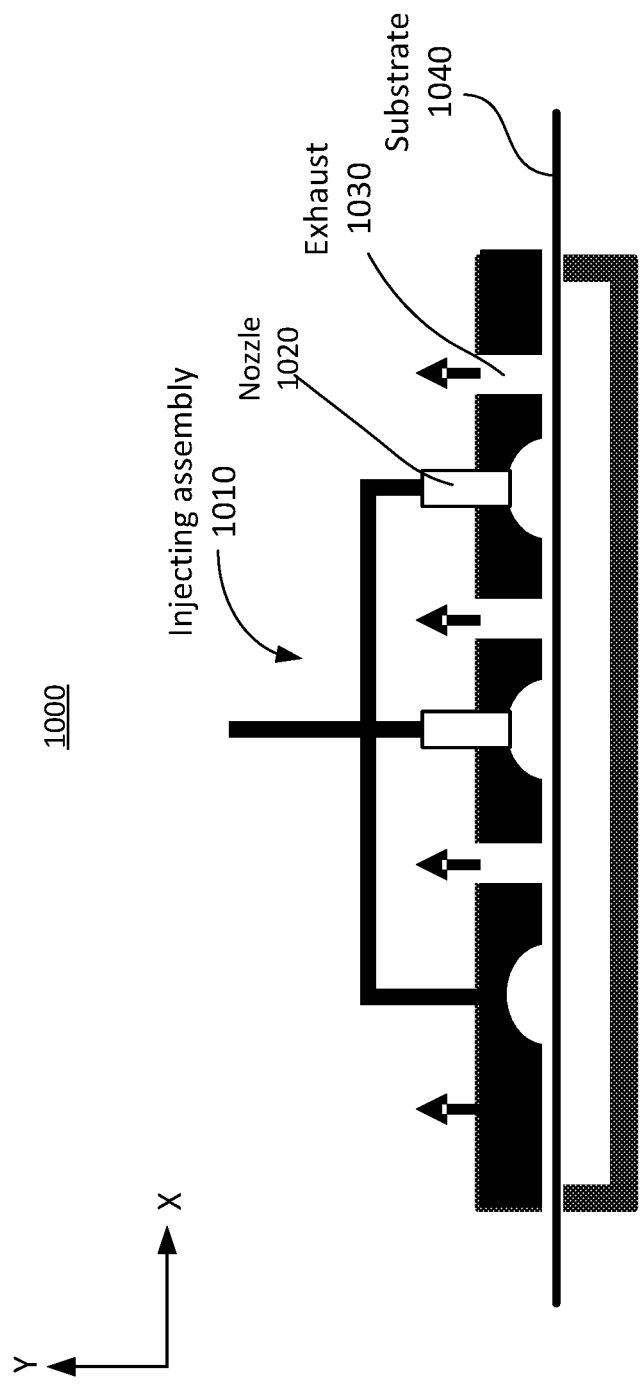
FIG. 10 is a schematic cross-sectional view of a surface treatment apparatus including an exhausting assembly, in accordance with an embodiment.

FIG. 10 is a schematic cross-sectional view of a surface treatment apparatus 1000 including an exhausting assembly, in accordance with an embodiment. The surface treatment apparatus 1000 is configured to improve surface properties of a substrate 1040. In addition to the exhausting assembly, the surface treatment apparatus 1000 also includes an injecting assembly 1010.

The injecting assembly 1010 periodically injects a mixture of a precursor and a SCF toward the substrate 1040. The mixture flows toward the substrate 1040 along a Y axis. The injecting assembly 1010 includes a plurality of nozzles 1020. An embodiment of the injecting assembly 1010 is the injecting assembly 100 in FIG. 1.

The exhausting assembly includes a plurality of exhausts 1030. An exhaust 1030 can be an opening (such as a slit) that is formed along the Y axis in a body of the surface treatment apparatus 1000. The exhausts 1030 discharge volatile by-products, SCF, excess precursor mixture and plasma gas, or some combination thereof from the surface treatment apparatus 1000. In embodiments where the surface treatment apparatus 1000 includes a plasma generator that generates plasma radicals from a plasma gas, the remaining plasma gas or plasma radicals can be discharged through the exhausting assembly.

Figure 11:
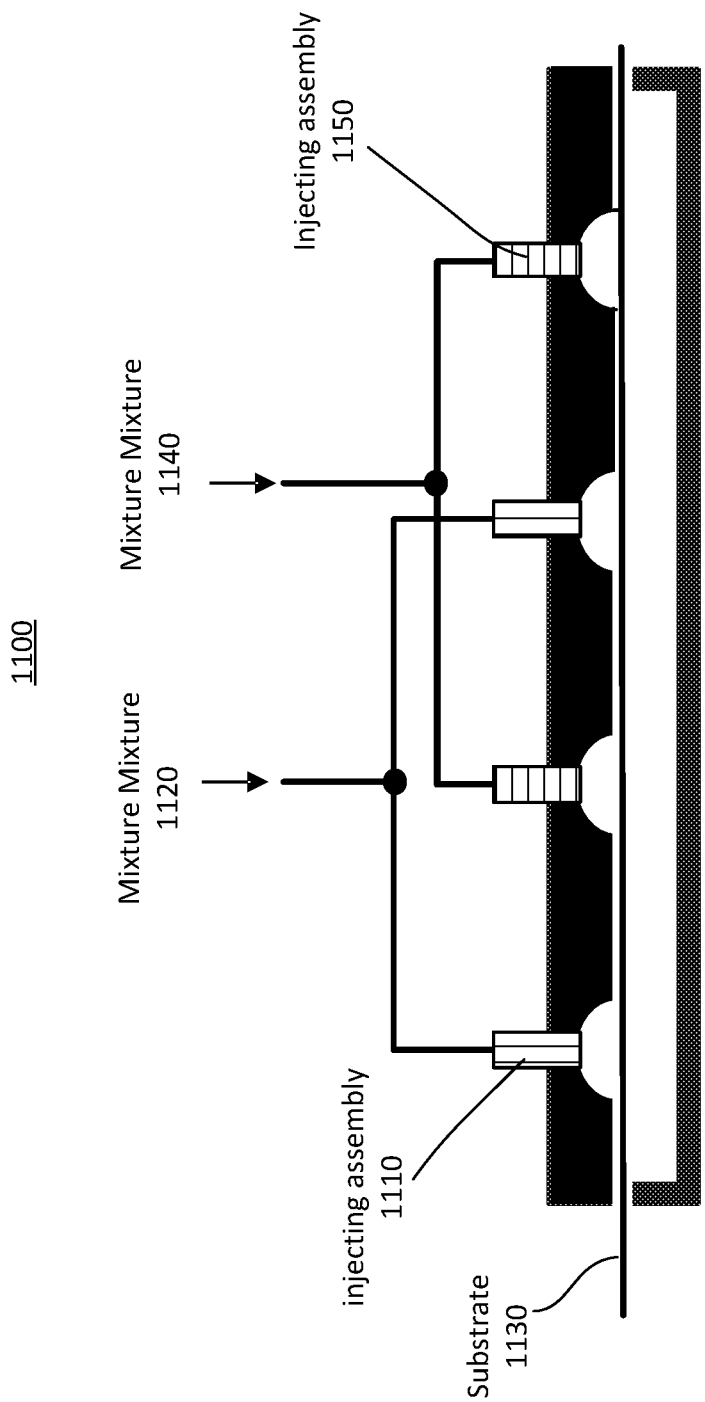
FIG. 11 is a schematic cross-sectional view of a surface treatment apparatus including two injecting assemblies, in accordance with an embodiment.

FIG. 11 is a schematic cross-sectional view of a surface treatment apparatus 1100 including two injecting assemblies 1110 and 1150, in accordance with an embodiment. The surface treatment apparatus 1100 improves surface properties of a substrate 1130 by using two different precursors. The injecting assembly 1110 injects a mixture 1120 of a first precursor and a first SCF toward the substrate 1130. An embodiment of the injecting assembly 1110 is the injecting assembly 100 in FIG. 1. Molecules of the first precursor penetrate into the substrate 1130. The injecting assembly 1150 injects a second mixture 1140 including a second precursor that is different from the first precursor toward the substrate 1130. In some embodiments, the second precursor is mixed with a SCF, such as the first SCF. Molecules of the second precursor can react with the molecules of the first precursor that ballistically penetrated into the substrate 1130 to transform the molecules of the precursor into a solid phase by chemical reactions. In some embodiments, the molecules of the second precursor can ballistically penetrated into the substrate 1130 which is covered by a viscous liquid-state surface right after the injection of the first precursor and can be changed into a different composition and/or different chemical structures.

The surface treatment apparatus 1100 can be used to prepare an organic-inorganic hybrid thin film. Molecules of the second precursor reacts with the ballistically injected molecules for the inorganic layer formed on the substrate surface by the first metallic precursor compound to form an organic-inorganic hybrid thin film.

Figure 12:
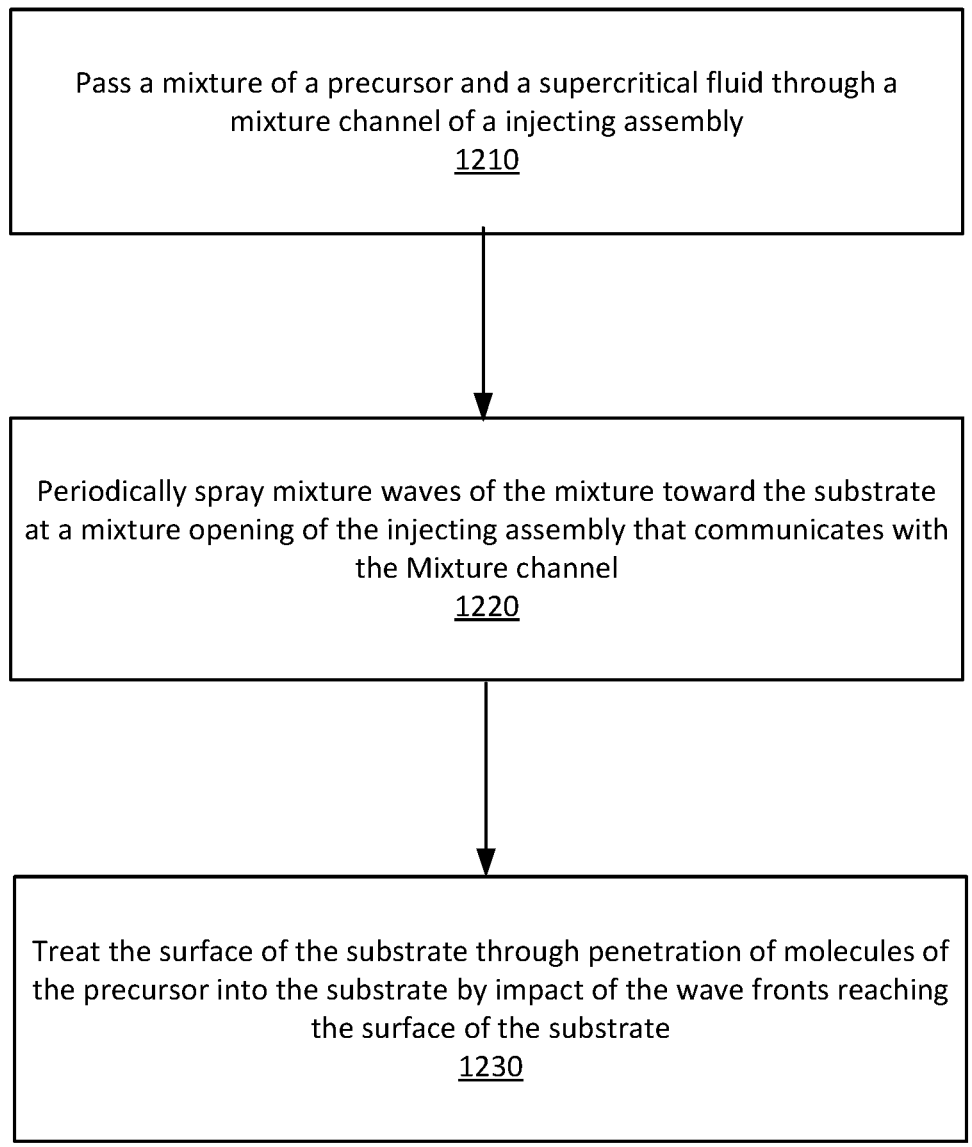
FIG. 12 is a flow chart illustrating a process for improving surface properties of a substrate, in accordance with an embodiment.

FIG. 12 is a flow chart illustrating a process 1200 for improving surface properties of a substrate, in accordance with an embodiment. The process can be performed by an injecting assembly that includes the nozzle 400 in FIGS. 4A-C. The process may include different or additional steps than those described in conjunction with FIG. 12 in some embodiments or perform steps in different orders than the order described in conjunction with FIG. 12.

The process 1200 includes passing 1210 a mixture of a precursor and a SCF through a mixture channel of an injecting assembly. The mixture is pressurized and has a pressure above a critical pressure of the SCF. The precursor can be a gas, liquid, or nano-sized solid. An example of the precursor is TMA. An example of the SCF is carbon dioxide.

The process 1200 also includes periodically injecting waves of the mixture toward the substrate at a mixture opening of the injecting assembly that communicates with the mixture channel. In some embodiments, the injecting assembly is placed under atmosphere pressure. After the waves of the mixture is injected, the SCF in the mixture expands instantaneously due to drop in pressure, causing the precursor to move at a high velocity toward the substrate. The waves propagate toward the substrate with a velocity above 100 meters per second. In some embodiments, a stream of a shaping fluid is injected toward the substrate at a shaper opening surrounding the mixture opening to confine the waves of the mixture. The stream of the shaping fluid can also shape the waves of the mixture. The shaping fluid can be the same material as the SCF in the mixture.

The process 1200 further includes treating the surface of the substrate through penetration of molecules of the precursor into the substrate by impact of the wave fronts reaching the surface of the substrate. The wave fronts form shock waves at the surface of the substrate. The shock waves enhance the penetration of the molecules of the precursor. The molecules of the precursor can penetrate into the substrate with a depth in a range from 0.1 nm to 10 nm. In some embodiments, the molecules of the precursor cross link with molecules of a material in the substrate to improve surface properties of the substrate.

In some embodiment, a reactant precursor is injected toward the substrate. Molecules of the reactant precursor react with the molecules of the precursor that penetrate into the substrate to transform the molecules of the precursor into a solid state. In some embodiments, the substrate is exposed to plasma radicals. The plasma radicals react with the molecules of the precursor that penetrate into the substrate to transform the molecules of the precursor into a solid state.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A process for treating a surface of a substrate, comprising:
    passing a mixture of a precursor and a supercritical fluid (SCF) through a mixture channel of an injecting assembly;
    periodically injecting waves of the mixture toward the substrate at a mixture opening of the injecting assembly that communicates with the mixture channel;
    treating the surface of the substrate through penetration of molecules of the precursor into the substrate by impact of wave fronts reaching the surface of the substrate;
    passing a shaping fluid through a shaper channel of the injecting assembly; and
    injecting a stream of the shaping fluid toward the substrate at a shaper opening of the injecting assembly surrounding the mixture opening to confine the waves and increase a pressure of the waves on the substrate.

2. The process of claim 1, wherein the waves propagate toward the substrate and generate shockwaves at the surface of the substrate.

3. The process of claim 2, wherein the waves propagate toward the substrate with a velocity not lower than 100 meters per second.

4. The process of claim 1, wherein the shaping fluid is the same material as the SCF in the mixture.

5. The process of claim 4, wherein the waves propagate toward the substrate under a pressure higher than a critical pressure of the SCF.

6. The process of claim 1, wherein a pressure of the mixture in the mixture channel is higher than a pressure of the shaping fluid in the shaper channel.

7. The process of claim 1, wherein the injecting assembly is placed under atmosphere pressure.

8. The process of claim 1, wherein the molecules of the precursor penetrate into the substrate up to a depth of 10 nm by the impact.

9. The process of claim 1, wherein the molecules of the precursor cross link with molecules of a material in the substrate.

10. The process of claim 1, further comprising:
    injecting a reactant precursor toward the substrate, molecules of the reactant precursor reacting with the molecules of the precursor that penetrate into the substrate to transform the molecules of the precursor into a solid state.

11. The process of claim 1, further comprising:
    exposing the substrate to plasma radicals that react with the molecules of the precursor that penetrate into the substrate to transform the molecules of the precursor into a solid state.

12. The process of claim 1, wherein the precursor is selected from a group consisting of: Trimethylaluminum, DMAON, Trisilylamine, PDMS (Polydimethylsiloxane), Silane coupling agents, Tetradimethylaminotitanium, Tetradimethylaminozirconium, Tetradimethylaminosilicon, silver sulfate, diol, thiol, amino, thio, and acids in carboxyl groups.

13. The process of claim 1, wherein the SCF is selected from a group consisting of: carbon dioxide, Methane, Ethane, Propane, Ethylene, Propylene, Methanol, Ethanol, and Acetone.

14. A process for treating a surface of a substrate, comprising:
    passing a mixture of a precursor and a supercritical fluid (SCF) through a mixture channel of an injecting assembly;
    periodically injecting waves of the mixture toward the substrate at a mixture opening of the injecting assembly that communicates with the mixture channel; and
    treating the surface of the substrate through penetration of molecules of the precursor into the substrate by impact of wave fronts reaching the surface of the substrate; and
    transforming the molecules of the precursor into a solid state either by injecting a reactant precursor toward the substrate, molecules of the reactant precursor reacting with the molecules of the precursor that penetrate into the substrate, or by exposing the substrate to plasma radicals that react with the molecules of the precursor that penetrate into the substrate.

15. The process of claim 14, further comprising:
    passing a shaping fluid through a shaper channel of the injecting assembly; and
    injecting a stream of the shaping fluid toward the substrate at a shaper opening of the injecting assembly surrounding the mixture opening to confine the waves and increase a pressure of the waves on the substrate.

16. The process of claim 15, wherein the waves propagate toward the substrate and generate shockwaves at the surface of the substrate.

17. The process of claim 15, wherein the shaping fluid is the same material as the SCF in the mixture.

18. The process of claim 15, wherein a pressure of the mixture in the mixture channel is higher than a pressure of the shaping fluid in the shaper channel.

19. The process of claim 14, wherein the injecting assembly is placed under atmosphere pressure.

20. The process of claim 14, wherein the molecules of the precursor penetrate into the substrate up to a depth of 10 nm by the impact.

21. The process of claim 14, wherein the molecules of the precursor cross link with molecules of a material in the substrate.

* * * * *